(12) United States Patent
Chernobrod et al.

(10) Patent No.: US 6,567,331 B2
(45) Date of Patent: May 20, 2003

(54) AVALANCHE BREAKDOWN MEMORY DEVICES AND METHOD OF USING THE SAME

(75) Inventors: Boris Chernobrod, Lexington, MA (US); Vladimir Schwartz, Lexington, MA (US)

(73) Assignee: Velor Incorporated, New York, NY (US)

(*) Notice: Subject to any disclaimer, the term of this patent is extended or adjusted under 35 U.S.C. 154(b) by 0 days.

(21) Appl. No.: 09/883,890

(22) Filed: Jun. 18, 2001

(65) Prior Publication Data

US 2002/0191464 A1 Dec. 19, 2002

(51) Int. Cl.$^7$ .......................... G06K 07/10; H01J 40/14
(52) U.S. Cl. .................. 365/215; 365/109; 365/122; 365/64; 365/10
(58) Field of Search ................ 365/215, 109, 365/122, 64, 10

(56) References Cited

U.S. PATENT DOCUMENTS

| | | | | |
|---|---|---|---|---|
| 5,315,105 A | * | 5/1994 | Matsuda et al. | 250/214 LS |
| 5,756,981 A | * | 5/1998 | Roustaei et al. | 235/462.42 |
| 2002/0160369 A1 | * | 10/2002 | Dorsel et al. | 435/6 |

* cited by examiner

Primary Examiner—Viet Q. Nguyen
(74) Attorney, Agent, or Firm—Dorsey & Whitney LLP

(57) ABSTRACT

A reverse bias voltage in combination with selective illumination can selectively write data into optical memory. The writing process can be completed quickly since parallel writing of data may be performed. The writing process generates an avalanche current that is used to change an element. The change can be destruction of the element or may be the alteration of property such as conductance or work function.

26 Claims, 13 Drawing Sheets

AVALANCHE BREAKDOWN MEMORY DEVICES AND METHOD OF USING THE SAME

FIELD OF THE INVENTION

The present invention generally relates to memory devices that use a light generated current and a method of using those devices. More particularly, the present invention relates to write once read many optical memory (WORM) devices that use avalanche breakdown to write data and a method of using those devices.

BACKGROUND

The most common forms of optical data storage are the compact disk (CD) and the digital versatile disk or digital video disk (DVD). CDs and DVDs that can be encoded one time by the user are referred to as write once read many (WORM) CDs and DVDs. DVDs are similar to CDs except that a smaller wavelength of light is used (e.g., blue instead of red) and may have data encoded on both sides of the disk. The data may be encoded or written into WORM CDs and DVDs by a laser beam. The writing of the data is slow since it is performed serially.

One type of writing is ablative writing. Ablative writing heats a material above its melting point causing a small hole. If the ablative writing process does not heat the material sufficiently, then an unstable amorphous mark is created which may vanish a few days later. Another problem is optical aberrations caused by the pressure within the optical CD or DVD. The presence of optical aberrations, unstable amorphous marks and the like are a problem for ablative WORM CDs and DVDs.

Another type of writing is phase change writing. Phase change writing rapidly heats and cools a phase change layer. A thin insulating layer is typically used in conjunction with a high power write laser to heat the phase change layer and a quenching layer is used to rapidly dissipate this heat. The insulation layer, the quenching layer and the high write power laser limit the general applicability to existing technology and increases the manufacturing cost.

Another form of data storage is programmable read only memory (PROM). PROM is a form electrically addressed memory that can be written to once by applying a voltage across a storage element to disable it. The process of disabling of elements is relatively slow because of the serial nature of PROM devices. Once formed, PROMs must be inspected to insure that their complex structure has been correctly formed. The inspection process adds time and expense to the manufacturing process. The cost of manufacture is further increased because the complex structure of PROM devices results in lower yields.

Accordingly, there is a strong need in the art for a reliable fast writing WORM device having a simple structure that may be written to in a simple manner.

SUMMARY OF THE INVENTION

An aspect of the invention provides for method of writing data to an optical storage media including providing a first voltage across a first pixel, the first pixel including a light emitting element that generates light in response to a second voltage being applied across the first pixel and illuminating the first pixel while providing the first voltage across the first pixel to induce a light induced avalanche breakdown current through the first pixel. The light induced avalanche breakdown current changes the first pixel such that the light emitting element will be prevented from generating light in response the second voltage being applied across the first pixel.

Another aspect of the invention provides for an optical storage media including a plurality of pixels, each pixel including a light emitting element capable avalanche breakdown in response to a first voltage being applied across the light emitting element and capable of generating light in response to a second voltage being applied across the light emitting element and a cathode and an anode for applying voltage to the light emitting element. The avalanche breakdown occurs when the light emitting element is illuminated while providing the first voltage across the light emitting element. The avalanche breakdown creates a current that causes a change that prevents the light emitting element from generating light in response the second voltage being applied across the light emitting element.

A further aspect of the invention provides for a method of writing data to an optical storage media including a plurality of pixels including providing a reverse bias voltage across a pixel, the pixel including an organic light emitting diode that generates light in response to a forward bias voltage being applied across the pixel and illuminating the pixel while providing the reverse bias voltage across the pixel to induce a light induced avalanche breakdown current through the pixel such that the light emitting element will be prevented from generating light in response the forward bias voltage being applied across the pixel.

A still further aspect of the invention provides for an optical storage media including a plurality of pixels, each pixel including a light emitting organic diode capable avalanche breakdown in response to a reverse bias voltage being applied across the light emitting organic diode and capable of generating light in response to a forward bias voltage being applied across the light emitting organic diode and a cathode and an anode for applying voltage to the light emitting organic diode. The avalanche breakdown occurs when the light emitting organic diode is illuminated while providing the reverse bias voltage across the light emitting organic diode. The avalanche breakdown creates a current that causes a change that prevents the light emitting organic diode from generating light in response the forward bias voltage being applied across the light emitting organic diode.

A still further aspect of the invention provides for a method of writing data to an optical storage media including providing a reverse bias voltage across a pixel, the pixel including a light emitting element and illuminating the pixel. The combination of illuminating the pixel and providing the reverse bias voltage across the pixel disables the light emitting element.

A still further aspect of the invention provides for an optical storage media including a plurality of pixels, each pixel including a light emitting element capable of being disabled in response to a first voltage being applied across the light emitting element and capable of generating light in response to a second voltage being applied across the light emitting element and a cathode and an anode for applying voltage to the light emitting element. The disabling occurs when the light emitting element is illuminated while providing the first voltage across the light emitting element and creates a current that causes a change that prevents the light emitting element from generating light in response the second voltage being applied across the light emitting element.

DETAILED DESCRIPTION

Figure 11:
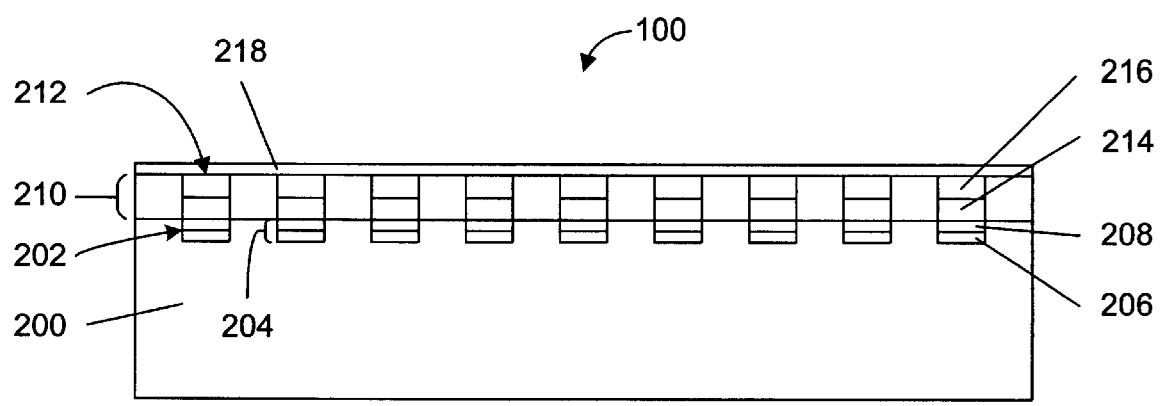
FIG. 11 is a side view of a device layer according to an exemplary embodiment.

In the drawings, like reference numerals designate like parts. FIG. 11 illustrates a side view of a completed device layer or element 100 according to an exemplary embodiment of the present invention. The completed device layer 100 includes a substrate 200 that provides structural support to the device layer 100. Indentations 202 on a surface of the substrate 200 provide a recess for a cathode electrode layer 204 such that a pit pillar structure layer 210 can be formed on a level surface. The pit pillar structure layer 210 includes pixel pits 212 that define and house the light emitting materials 214, 216. On one side of the pit pillar structure layer 210 is the cathode electrode layer 204 which has a transparent conductor sub-layer 206 to insure the good conductivity of the cathode electrode layer 204 and an electron emission sub-layer 208 to insure there are sufficient majority carriers (electrons) being supplied to a n-type light emitting material 214. On the other side of the pit pillar structure layer 210 are the anodes 218 that complete the electric circuit through each pixel pit 212 that enables excitation voltage to be applied. It is this excitation voltage that causes the light emitting materials 214, 216 to generate light. It should be noted that alterations and/or additional elements may be included in the device layer 100 without departing from the spirit or scope of the present invention.

The n- and p-type light emitting materials 214, 216 form a pn junction that under a forward bias voltage will emit light (photons) when majority carriers (electrons) from the n-type material 214 recombine with minority carriers (holes) from the p-type light emitting material 216. A small current flows through the pn junction while a reverse bias is applied and the pixel is not illuminated. This current increases by several orders of magnitude when the light emitting materials 214, 216 are illuminated due to avalanche breakdown. The avalanche breakdown current can be used to alter the pn junction, cathode 204, the anode 218 or another element such as a fuse 220 to prevent the generation of light.

It is advantageous to keep the excitation voltage between the minimum voltage for avalanche breakdown with illumination and minimum voltage for avalanche breakdown without illumination. Avalanche breakdown will occur without illumination if the reverse bias voltage is sufficiently large (e.g., 5–8 volts) and will not occur at all if the reverse bias voltage is too small. Between these two voltages is a range of voltages where avalanche breakdown will occur upon illumination. This illumination may be used to select whether or not a pixel is disabled and may be performed simultaneously (i.e., in parallel) over an entire layer. Alternatively, only portions of a layer may be written to in parallel, e.g., as writing to every other pixel to avoid accidental or spurious disabling. The ability to write to the pixel in parallel substantially reduces writing time as compared to serial writing techniques. Multilayer devices may be written to by parallel writing to each of individual layers in series. In all instances, the excitation voltage should preferably be somewhere in the middle of the range of voltages where illumination can cause avalanche breakdown to allow for fabrication variations and the like.

The prevention of light generation can be controlled by the proper selection of the materials of the device layer 100, by the proper selection of the geometry of the various elements of the device layer 100, by the further processing of existing layers or elements of the device layer 100 and/or by the inclusion of additional elements or layers into the device layer 100. For example, changing one or more properties of a layer or destroying that layer while leaving the other layers unaffected can be controlled by using one material that has a lower threshold to current than the other layers. The changing of a layer also can be controlled with geometrical variations, such as narrow regions, that increase the current through the narrow regions and make those regions the first to fail or be altered for a given excitation. The changing of a layer also can be controlled by further processing of one or more layers, such as by doping, causing diffusion or adjusting the degree of crystallinity, in order to select (e.g., reduce or increase) the threshold of a layer or part of a layer. The changing of a layer also can be controlled by the addition of a layer or element such as a fuse 220 or an oxidation enabling layer. The fuse 220 could be an additional diode that breaks down prior to any other element. The oxidation enabling layer could be added between the transparent conductor sub-layer 206 and a metal monolayer electron emission sub-layer 208 such that the metal monolayer electron emission sub-layer 208 will combine with the oxidation enabling layer to form a metal oxide layer. The oxidation of the electron emission sub-layer 207 could prevent light generation because the electron emission sub-layer 208 no longer provides sufficient carriers for light generation or the oxidation of the electron emissive sub-layer 208 could have an impedance sufficiently large that a voltage for light generation is no longer applied across the light emissive materials 214, 216. Other alterations and/or additional elements may be included in the device layer 100 without departing from the spirit or scope of the present invention.

Figure 1:
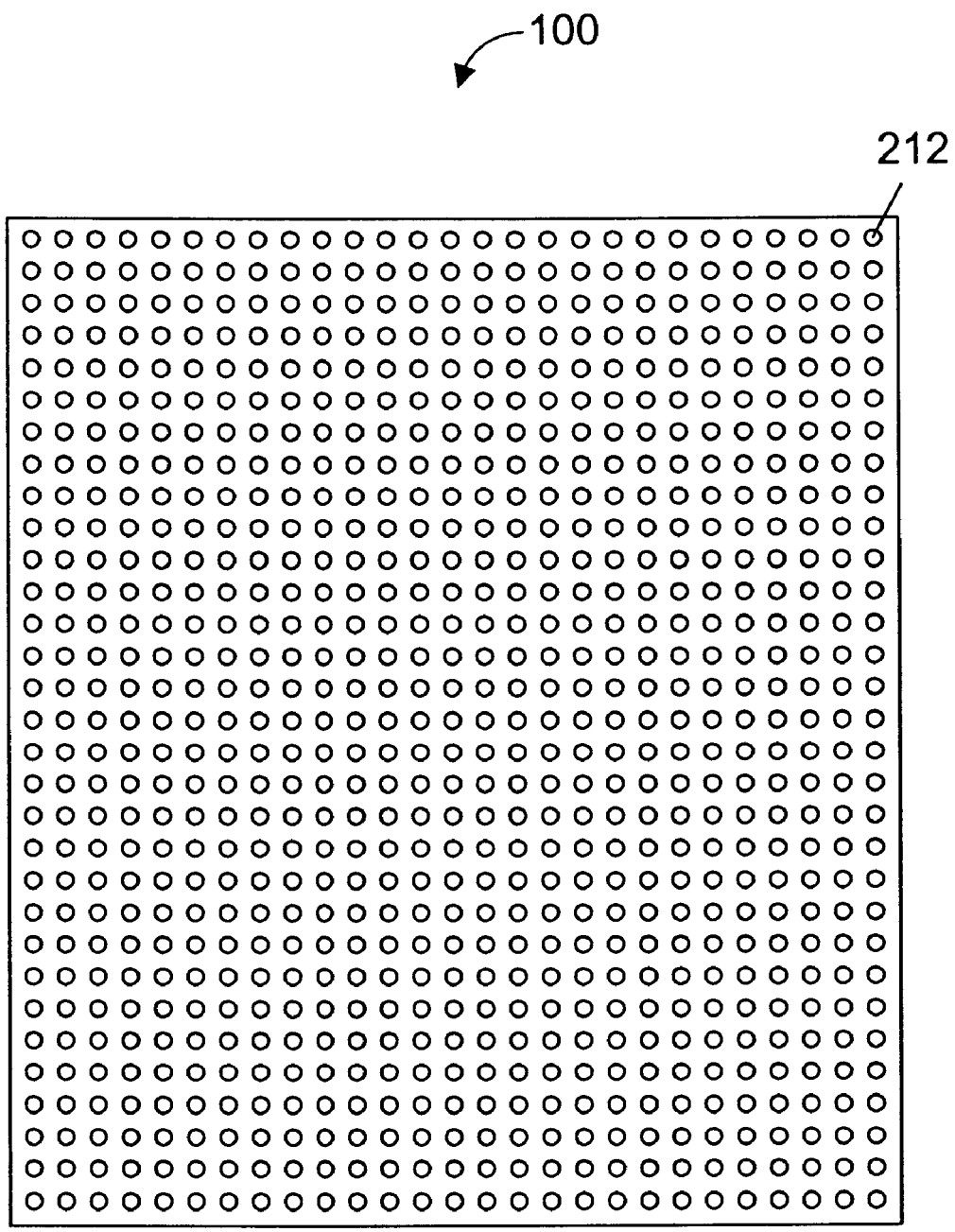
FIG. 1 is a top view of a device layer illustrating the arrangement of pixel pits.

FIG. 1 is a top view of device layer 100 and illustrates the arrangement of the pixel pits 212. The pixel pits 212 are of substantially equal size and arranged in an M×N matrix. The pixel pits 212 are circular or substantially circular with a diameter of less than or equal to 1 $\mu$m. Preferably, the pixel pits 212 have a diameter of about 0.5 $\mu$m or smaller. Alternatively, the pixel pits 212 may be as large as desired, typically about 5 $\mu$m or even 10 $\mu$m, or smaller than about 0.5 $\mu$m. Preferably the pixel pits 212 have dimensions in the range of about 0.5 to 1.0 μm. Alternatively, the pixel pits 212 can be any regular shape including rectangles, squares, pentagons and the like or may be portions of elongated grooves.

Figure 2:
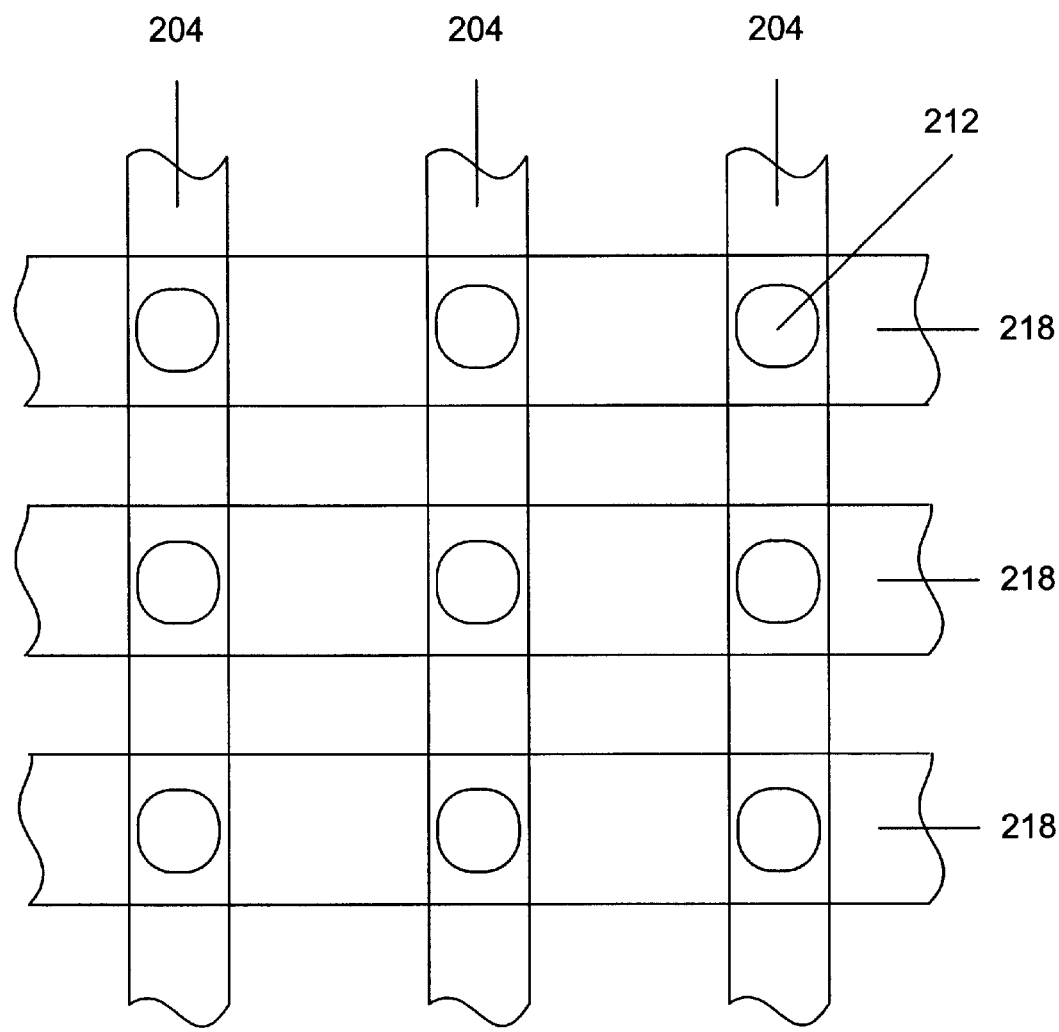
FIG. 2 is a partial top view of a device layer illustrating the relationship of the cathodes, anodes and pixel pits.

FIG. 2 is a partial top view of a device layer 100 illustrating the relationship of the cathodes 204, anodes 218 and pixel pits 212. In this exemplary embodiment, the cathodes 204 and anodes are striped conductors oriented in orthogonal directions. The pixel pits 212 that contain the light emitting materials 214, 216 are located where the cathodes 204 and anodes 218 overlap one another. An excitation voltage applied to the ends of one of the cathodes 204 and one of the anodes 218 results in the excitation voltage being applied to the light emitting materials 214, 216 in the pixel pit 212 that are sandwiched between that one cathode 204 and that one anode 218. The excitation voltage may be a forward biased excitation voltage capable of causing light generation by the light emitting materials 214, 216 or may be a reverse biased excitation voltage to enable writing data. It is also possible to have configurations that are not striped or orthogonal, and that include active elements.

Figure 3:
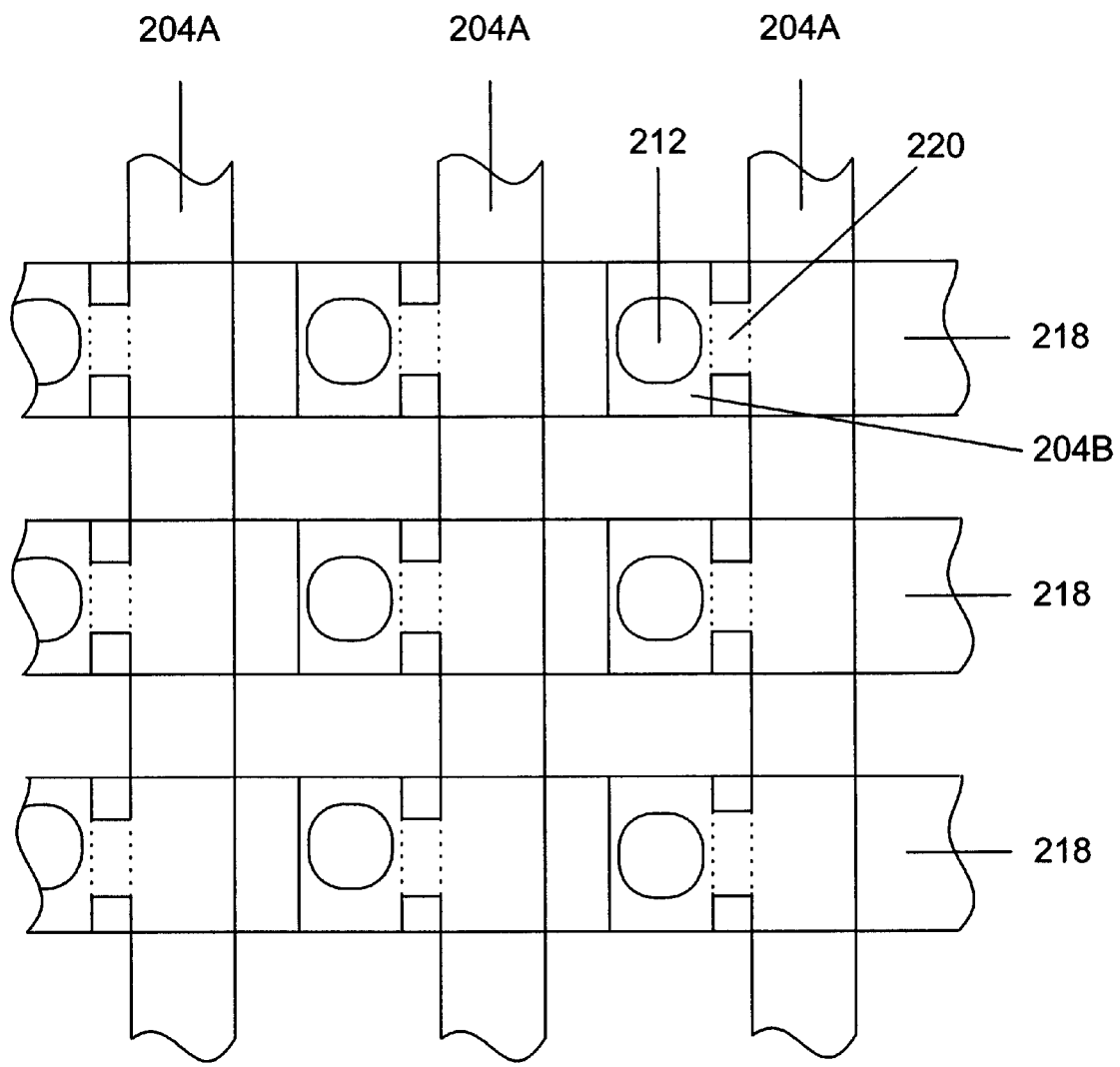
FIG. 3 is a partial top view of a device layer illustrating the relationship of cathode bus portions, fuses, cathode pixel portions, anodes, and pixel pits in another exemplary embodiment.

FIG. 3 is a partial top view of a device layer 100 illustrating the relationship of the cathode bus portions 204A, fuses 220, cathode pixel portions 204B, anodes 218 and pixel pits 212. This exemplary embodiment is similar to the exemplary embodiment of FIG. 2 except that the cathode 204 has a bus portion 204A and a pixel portion 204B connected by a fuse 220. The fuse 220 can be a region between the bus portion 204A and the pixel portion 204B that is altered when a current of sufficient magnitude passes through it. The alteration of the fuse 220 could destroy the fuse 220 or could change its conductance. Destruction of the fuse 220 will electrically isolate the pixel portion 204B from the bus portion 204A. A change in the conductance of the fuse 220 may electrically isolate the pixel portion 204B from the bus portion 204A if the change is great enough or may reduce the amount of voltage seen by the light emitting materials 214, 216 by voltage division. A chemical change (e.g., oxidation) or a matter organization change may accomplish the change in the conductance (e.g., crystalline structure changed to amorphous structure). The fuse 220 can be made from the original material or materials of the cathode 204, from the material or materials of the cathode 204 that are altered (e.g., doped, oxidized, or recrystallized from an amorphous state) or can be made separately from entirely different materials. The region that forms the fuse 220 can be narrower or the same size as the pixel portion 204A. Alternatively, the bus portions, fuses and pixel portions could be formed in the anode 218 instead of the cathode 204.

Figure 4:
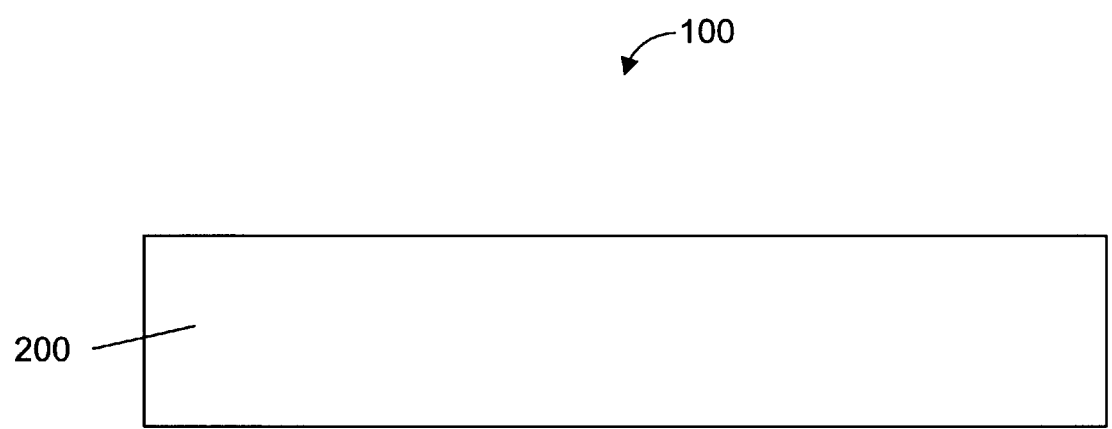
FIG. 4 is a side view of a substrate prior to processing.

FIG. 4 is a side view of a substrate 200 prior to processing. The substrate 200 may be made from any suitable imprintable substrate material. For example, a 25 μm thick polymethyl methacrylate substrate could be used.

Figure 5:
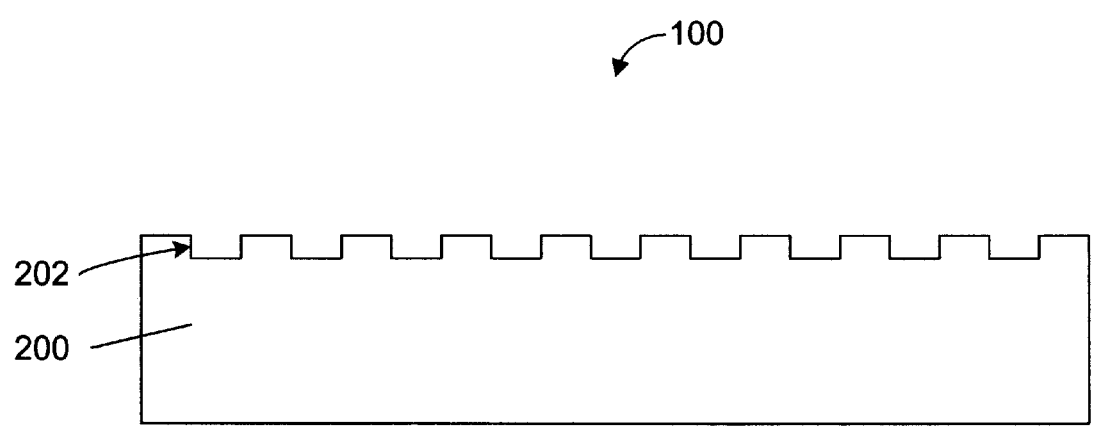
FIG. 5 is a side view of a substrate after being imprinted with indentations.

FIG. 5 is a side view of the substrate 200 shown in FIG. 3 after being imprinted with indentations 202. In an exemplary embodiment, the indentations 202 are a few hundred nanometers in depth. The indentations 202 can be formed by nanoimprinting in accordance with the nanoimprinting lithographic method disclosed in U.S. Pat. No. 5,772,905 or by another suitable method such as laser ablation.

Figure 6:
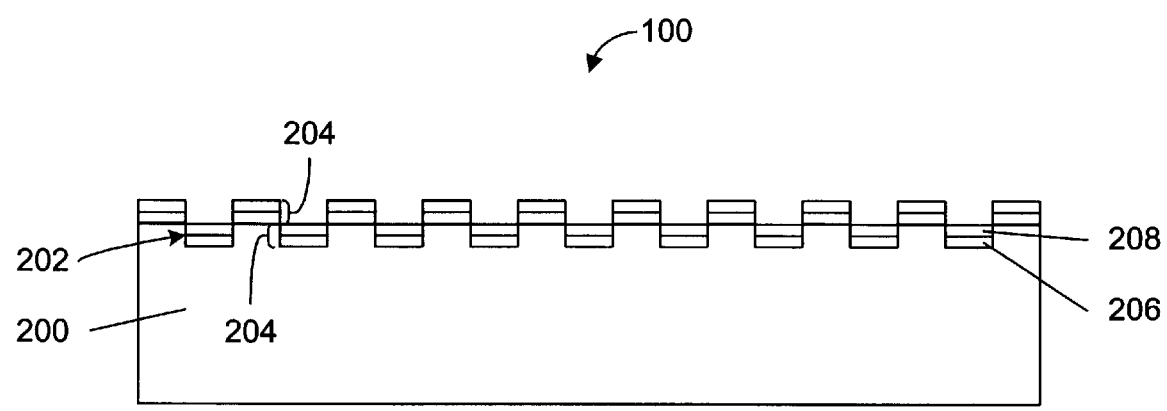
FIG. 6 is a side view of a substrate after vapor deposition of a cathode electrode layer.

FIG. 6 is a side view of the substrate shown in FIG. 5 after vapor deposition of the cathode electrode layer 204. The cathode electrode layer 204 includes a transparent conductor sub-layer 206 and an electron emission sub-layer 208. The transparent conductive sub-layer 206 can be a transparent conductive oxide such as indium tin oxide or aluminum zinc oxide or any other transparent conductive material. The electron emission sub-layer 208 can be any metal or other non-metal material having a low work function and a high carrier concentration (e.g., magnesium, palladium, or a polymer material). The electron emission sub-layer 208 may be made from a monolayer.

A treatment may be applied to the transparent conductor sub-layer 206 in order to facilitate and/or control the change to a layer. For example, transparent conductive oxide layer could be lightly doped with oxygen and then a monolayer of metal could be deposited as the electron emission sub-layer 208. The oxygen could then oxidize the monolayer of metal upon generation of the avalanche breakdown current. The oxidation of the monolayer of metal could be used to increase the work function of the monolayer and thereby prevent the generation of light even if the monolayer of metal remained conductive after being oxidized. Alternatively, a separate oxidation enabling layer could be placed between the transparent conductor sub-layer 206 and an electron emission sub-layer 208 instead of doping.

Figure 7:
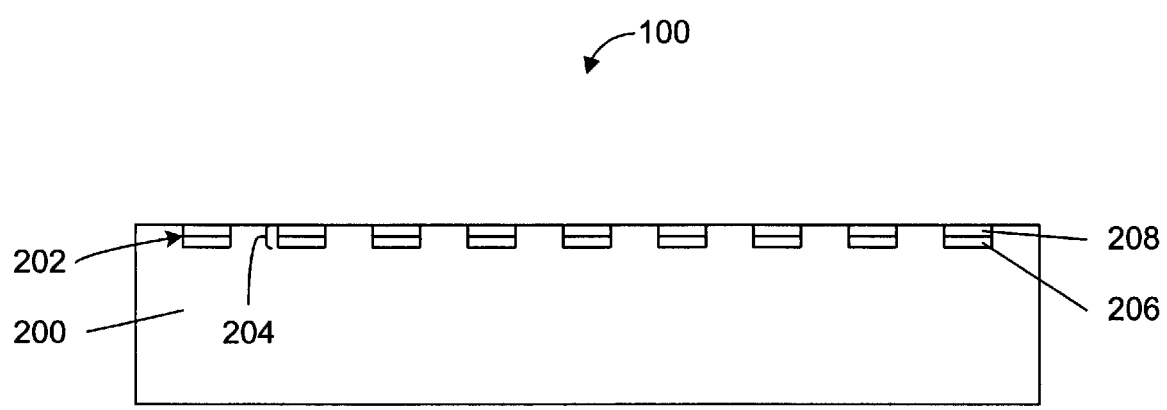
FIG. 7 is a side view of a partially completed device layer after patterning of the cathode electrode layer.

FIG. 7 is a side view of the partially completed device layer shown in FIG. 6 after patterning of the cathode electrode layer 204. The cathode electrode layer 204 is removed from those areas of the nanoimprinted substrate 200 that are outside the indentations 202. The removal of the cathode electrode layer 204 may be achieved with an argon plasma etch, chemical mechanical polishing or any other method that will remove the cathode electrode layer 204 that is outside of the indentations 202 while leaving the cathode electrode layer 204 that is inside the indentations 202. Cathode electrode layer 204 material also may be removed from the indentations 202 to provide space for a fuse 220.

Figure 8:
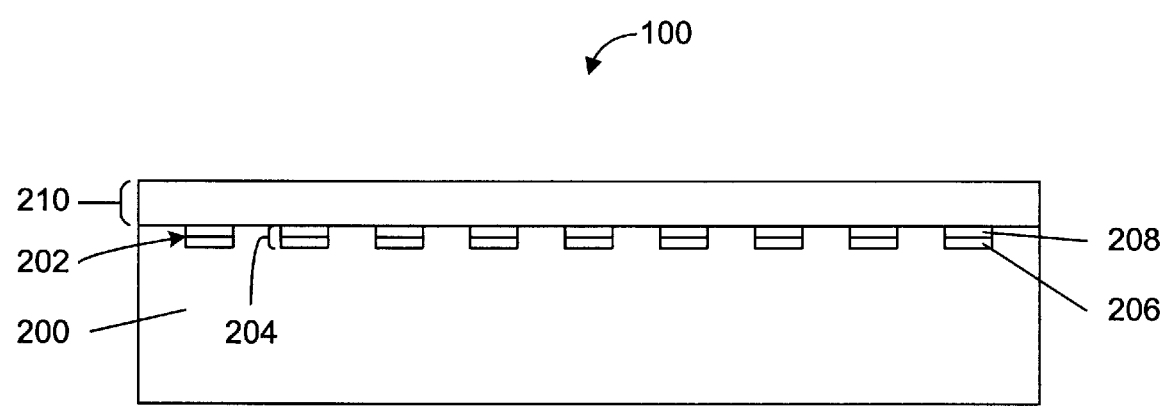
FIG. 8 is a side view of a partially completed device layer after deposition of a pit pillar structure layer.

FIG. 8 is a side view of the partially completed device layer shown in FIG. 7 after deposition of the pit pillar structure layer 210. The pit pillar structure layer 210 may be made from an ultraviolet curable photopolymer or any other suitable material capable of being patterned in the sub-micron range.

Figure 9:
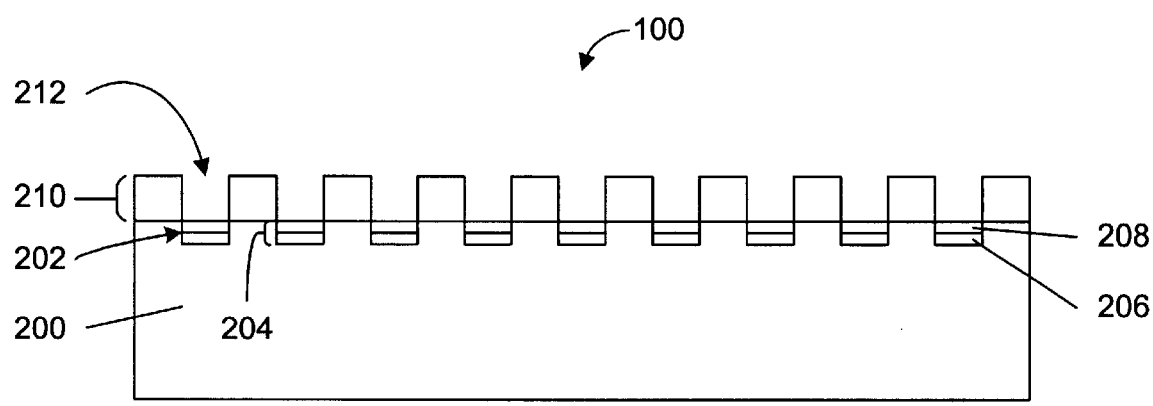
FIG. 9 is a side view of a partially completed device layer after forming pixel pits in a pit pillar structure layer.

FIG. 9 is a side view of the partially completed device layer shown in FIG. 8 after a hot embossing method or another suitable method such as laser ablation is used to form pixel pits is 212 in the pit pillar structure layer 210. The hot embossing method uses a stamper having a surface configured to produce the desired pattern of pixel pits 212. The pit pillar structure layer 210 is relatively thin (e.g., about 200 nm) and can be formed to have pillars with extremely small diameters (e.g., about 500 nm or less). The pit pillar structure layer 210 material remaining at the bottom of the pixel pits 212 is removed with a reactive ion etching or another suitable method. The cathode electrode layer 204 is then treated with an oxygen plasma or another suitable method to enable good contact with an n-type polymer material 214 that is to be deposited in the pixel pits 212. All or a portion of the cathode electrode layer 204 may also be treated to assist or enable an avalanche breakdown current to alter or destroy all or part of a component of the device layer 100 so as to prevent light from being generated by the light emitting materials 214, 216 when a forward bias voltage is applied.

Figure 10:
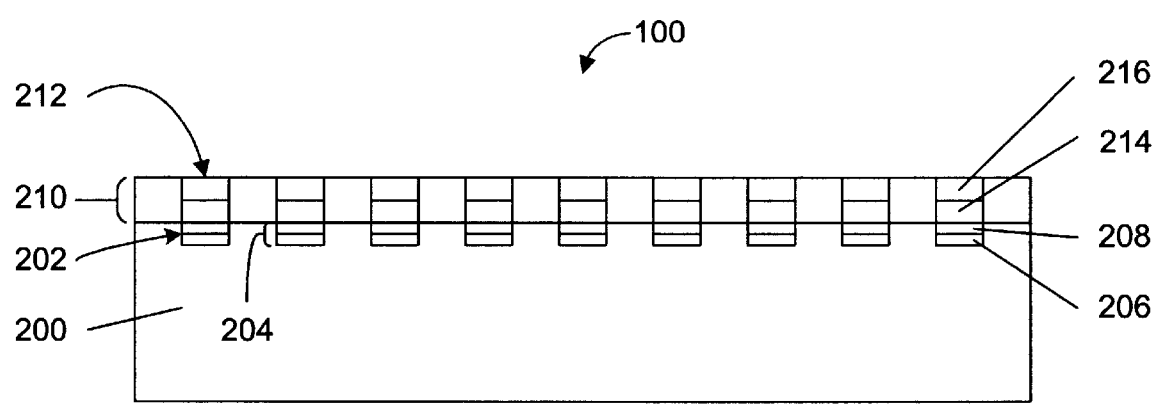
FIG. 10 is a side view of a partially completed device layer after deposition of the light emitting pixel materials.

FIG. 10 is a side view of the partially completed device layer shown in FIG. 9 after deposition of the light emitting materials 214, 216. The n-type light emitting material 214 is formed by a liquid deposition method. Liquid deposition methods include pit filling methods such as molecular adhesion and electro-deposition methods such as electro-polymerized. The ability of the pit filling methods to fill the pixel pits 212 are limited by the adhesive characteristics and molecular size of the materials used. A p-type light emitting material 216 is similarly formed on top of the n-type light emitting material 214. The light emitting materials 214, 216 can be any semiconducting organic polymer material or materials that can be formed into a pn light emitting diode. Alternatively, other semiconducting materials, such as inorganic semiconductors, may also be used. The light emitting materials 214, 216 may be selected to have substantially the same thickness and have a combined thickness substantially equal to a thickness of the pit pillar structure layers 210 (e.g., each light emitting layer is 100 nm thick).

The light emitting organic polymer or polymers that form the light emitting materials 214, 216 are deposited and/or flow into the pixel pits 212 because they are in a liquid state.

The liquid light emitting materials 214, 216 are initially deposited over the surface of the device layer 100 and then flow from the higher points to the lower points. Non-liquid depositions such as vapor depositions are unable to flow and will remain where initially deposited. Thus, the flow of the liquid light emitting materials 214, 216 from the top of the pit pillar structure layer 210 (i.e., the higher points) into the pixel pits 212 (i.e., the lower points) obviates the need to etch or otherwise pattern the light emitting organic polymer materials initially deposited outside the pixel pits 212.

The light emitting materials 214, 216 are indirectly patterned by the patterning of the pit pillar structure layer 210. Specifically, the patterning of the pit pillar structure layer 210 produces a topography that directs the liquid deposited light emissive material 214, 216 into the pixel pits 212 since the pixel pits 212 happen to be the topographical low points. Thus, the pattern of the pit pillar structure layer 210 determines the pattern of the light emissive materials 214, 216 without requiring a traditional patterning of the light emissive materials 214, 216. This is important because the light emitting materials 214, 216 are poorly suited to patterning by conventional methods while the materials of the pit pillar structure layer 210 are well suited to patterning. Accordingly, the much smaller dimensional limits of the pit pillar structure layer 210 as compared to the dimensional limits of the light emitting materials 214, 216 allows for a decreased pixel size that greatly increases the density with which data may be stored.

Excess light emitting polymer material may be removed with argon plasma or another suitable plasma or with a more expensive polishing technique such as chemical mechanical polishing.

FIG. 11 is a side view of the partially completed device layer shown in FIG. 10 after formation of the anodes 218. A transparent conductor such as indium tin oxide is deposited to a thickness of about 100 nm by vacuum deposition or liquid deposition. The deposited transparent conductor is then patterned with an etching process to form the anodes 218. The addition of the anodes 218 completes the device layer 100. The device layer 100 may now be tested by conventional means to determine whether or not the device layer is defective. The non-defective device layers 100 can be individually used in devices or may be laminated with other non-defective device layers 100 to form a multi-layer laminate that can be used in devices.

Figure 12:
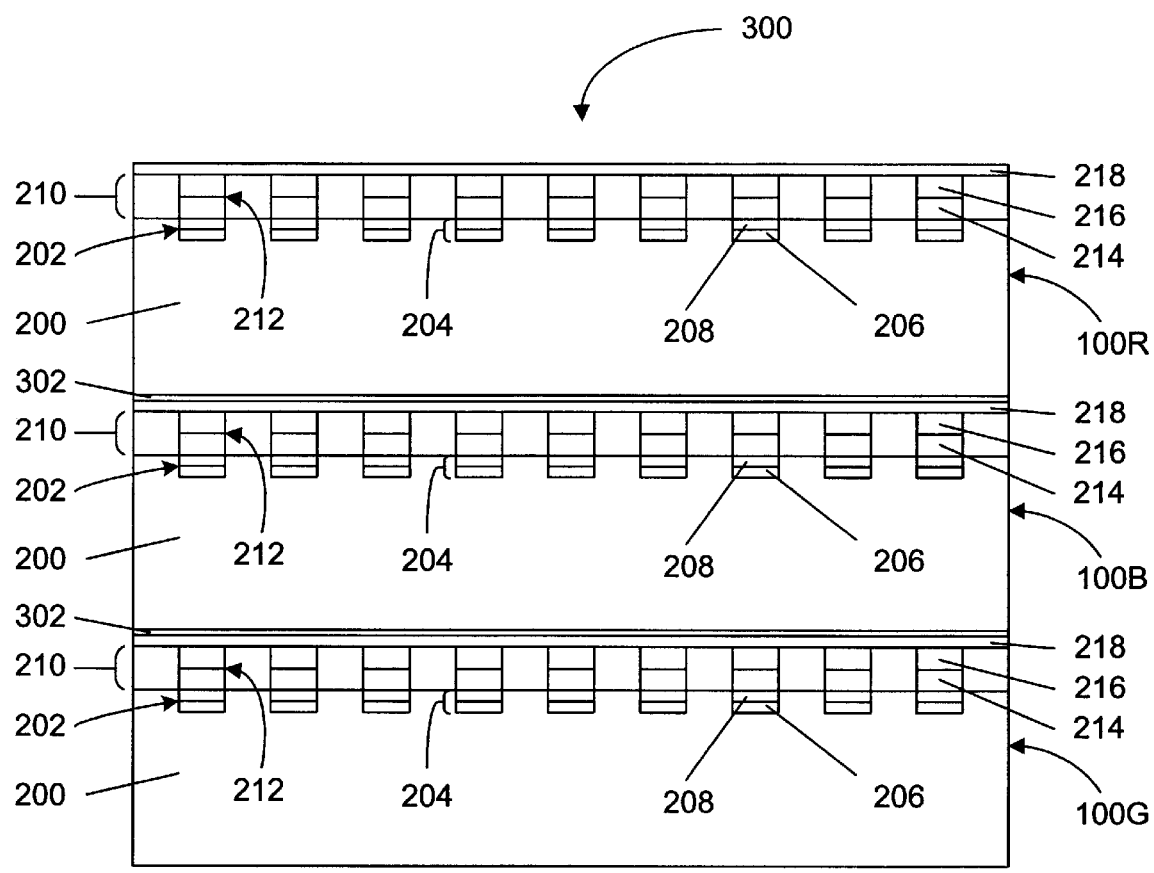
FIG. 12 is a side view of a multi-layer laminate according to another exemplary embodiment.

FIG. 12 is a side view of a multi-layer laminate 300 according to an exemplary embodiment of the present invention. The laminate 300 includes three completed device layers 100R, 100B, 100G. The completed device layers 100R, 100B, 100G each produce light of a different frequency. In this figure, the first completed device layer 100R produces red light, the second completed device layer 100B produces blue light and the third completed device layer 100G produces green light. In any given laminate 300, the device layers 100 may be attached to each other with an adhesive 302 such as a pressure sensitive adhesive or by thermal bonding, photopolymerization or another suitable method. A device layer 100 may be peeled from a laminate 300 if the device layer 100 is discovered to be damaged or otherwise defective. This improves the overall yield for laminate 300 production making the laminate less expensive to produce.

Figure 13:
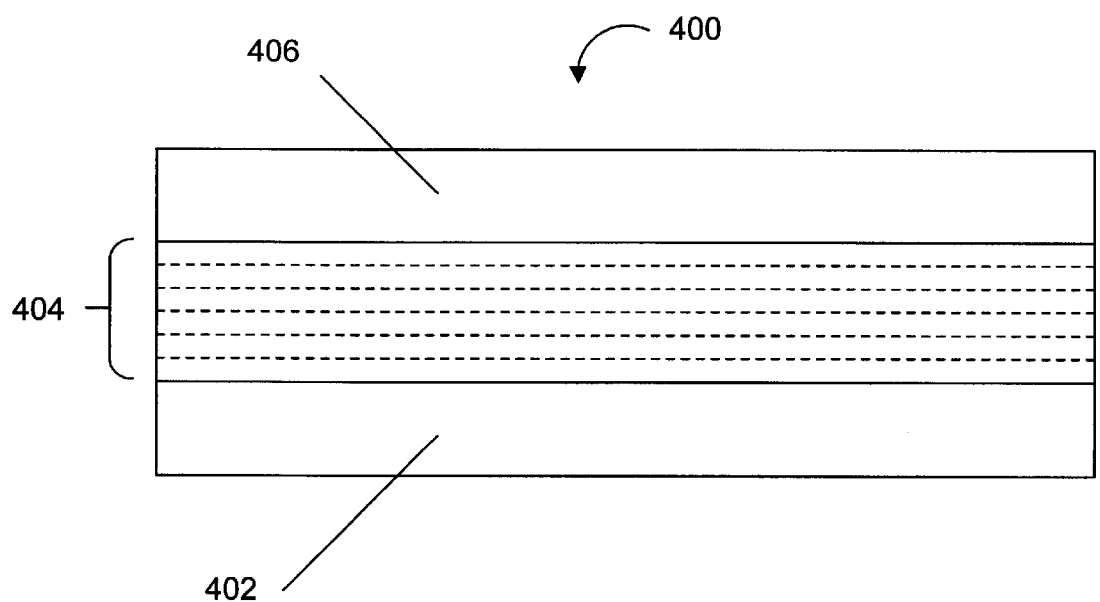
FIG. 13 is a side view of a WORM device.

FIG. 13 is a side view of a WORM device 400. The WORM device 400 includes a light emitting array 402, a memory 404 and an imager 406. The memory 404 can be a single layer or a laminate of the present invention. The light emitting array 402 can be any kind of light emitting device and is not limited to high power writing lasers or the like. The light emitting array 402 provides illumination to the memory 404 to encode data into the memory 404. The imager 406 may be any sort of imager capable of sensing light from the memory 404 at the required rate. Commonly used imagers 406 include complementary metal oxide semiconductor (CMOS) imagers or charge coupled device (CCD) imagers.

Additional layers and elements may also be incorporated into the present invention. For example, optical films may be included to improve the optical coupling of light between the device layers (e.g., antireflective films). Additionally, layers and elements already part of the present invention may be selected and/or formed to provide multiple functions. For example, the thickness and refractive index of an adhesive used to couple two adjacent device layers 100 could be selected to better couple light between the device layers 100. The above description is for devices formed by a vertical stack of elements which is sometimes called a cell. The present invention could also be applied to a plurality of cells connected horizontally.

The small pixel size of the organic light emitting devices of the present invention is well suited to optical memory. The invention may also be applied to display devices, especially color display devices and other devices having electroluminescent elements.

Although several embodiments of the present invention and its advantages have been described in detail, it should be understood that changes, substitutions, transformations, modifications, variations, permutations and alterations may be made therein without departing from the teachings of the present invention, the spirit and the scope of the invention being set forth by the appended claims.

We claim:

1. A method of writing data to an optical storage media comprising:
   providing a first voltage across a first pixel, the first pixel including a light emitting element; and
   illuminating the first pixel;
   wherein the illuminating the first pixel in combination with providing the first voltage across the first pixel disables the light emitting element.

2. The method of claim 1, wherein the change renders the light emitting element unable to generate light in response to the second voltage.

3. The method of claim 2, wherein the light emitting element is unable to generate light in response to the second voltage because a pn junction of the light emitting element has been broken down.

4. The method of claim 3, wherein the light emitting element is formed from a light emitting organic polymer material.

5. The method as in claim 1, wherein the first voltage comprises a reverse bias voltage; and the combination of illuminating the pixel and providing the reverse bias voltage across the pixel disables the light emitting diode.

6. The method of claim 5, wherein the combination renders the light emitting element unable to generate light in response to a forward bias voltage.

7. The method of claim 6, wherein the combination breaks down a pn junction of the light emitting element.

8. The method of claim 7, wherein the light emitting element is formed from a light emitting organic polymer material.

9. The method of claim 5, wherein the pixel includes an electron emissive sub-layer having a low work function and high carrier concentration; and wherein the combination changes the electron emissive sub-layer by increasing the work function and decreasing the carrier concentration such that the light emitting element will not generate light in response to a forward bias voltage.

10. The method of claim 9, wherein the electron emissive sub-layer is a metallic monolayer.

11. The method of claim 5, wherein at least a portion of either an anode electrode or cathode electrode of the pixel is destroyed by the combination such that the light emitting element will not generate light in response to a forward bias voltage.

12. The method of claim 5, wherein the pixel includes a fuse having a conductance that is substantially reduced by the combination.

13. The method of claim 5, further comprising a plurality of pixels.

14. The method of claim 5, wherein in the light emitting element has a dimension of less then or equal to 1 $\mu$m.

15. The method as in claim 1, wherein:

the light emitting element generates light in response to a second voltage being applied across the first pixel;

the illuminating the first pixel is performed while providing the first voltage across the first pixel to induce a light induced avalanche breakdown current through the first pixel; and in combination with providing the first voltage across the first pixel disables the light emitting element further includes the light induced avalanche breakdown current changes the first pixel such that the light emitting element will be prevented from generating light in response to the second voltage being applied across the first pixel.

16. The method of claim 15, wherein the first pixel includes an electron emissive sub-layer having a low work function and high carrier concentration that is changed by the light induced avalanche breakdown current such that the work function is increased and the carrier concentration is decreased such that the light emitting element will not generate light in response to the second voltage.

17. The method of claim 16, wherein the electron emissive sub-layer is a metallic monolayer.

18. The method of claim 15, wherein at least a portion of either an anode electrode or cathode electrode of the first pixel is destroyed by the light induced avalanche breakdown current such that the light emitting element will not generate light in response to the second voltage.

19. A The method of claim 15, wherein the first pixel includes a fuse having a conductance that is substantially reduced by the light induced avalanche breakdown current.

20. The method of claim 15, further comprising:

providing the first voltage across second pixel, the second pixel including a light emitting element that generates light in response to the second voltage being applied across the second pixel; and illuminating the second pixel while providing the voltage across the second pixel to induce a light induced avalanche breakdown current through the second pixel, wherein the light induced avalanche breakdown current changes the second pixel such that the light emitting element will be prevented from generating light in response the second voltage being applied across the second pixel, and wherein providing the first voltage across the pixel and luminating the first pixel are performed in parallel with providing the first voltage across the second pixel and luminating the second pixel.

21. The method of claim 15, wherein the first voltage is a reverse bias voltage and the second voltage is a forward bias voltage.

22. The method of claim 15, wherein in the light emitting element has a dimension of less then or equal to 1 um.

23. An optical storage media comprising:

at least one pixel having a light emitting element and a cathode and an anode for applying a voltage across the light emitting element of the pixel;

the light emitting element capable of being disabled in response to a first voltage being applied across the light emitting element and capable of generating light in response to a second voltage being applied across the light emitting element; and wherein the disabling occurs when the light emitting element is illuminated while providing the first voltage across the light emitting element, and the disabling creates a current that causes a change that prevents the light emitting element from generating light in response the second voltage being applied across the light emitting element.

24. An optical storage media as in claim 23, wherein the disabling comprises avalanche breakdown.

25. An optical storage media comprising a first pixel including a light emitting element and electrodes disposed to provide a first voltage across portions the said first pixel; the optical storage media characterized in that illumination of the first pixel in combination with providing the first voltage across portions of the first pixel disables the light emitting element.

26. An optical storage media as in claim 25, wherein the disabling comprises avalanche breakdown.

* * * * *

UNITED STATES PATENT AND TRADEMARK OFFICE
CERTIFICATE OF CORRECTION

PATENT NO. : 6,567,331 B2 Page 1 of 1
DATED : May 20, 2003
INVENTOR(S) : Chernobrod et al.

It is certified that error appears in the above-identified patent and that said Letters Patent is hereby corrected as shown below:

<u>Title page,</u>
After Item [73], insert -- Assignee: Optabyte, Inc., Lexington, Massachusetts --

Signed and Sealed this

Seventh Day of September, 2004

JON W. DUDAS
*Director of the United States Patent and Trademark Office*